United States Patent [19]

Cohen et al.

[11] Patent Number: 4,820,993

[45] Date of Patent: Apr. 11, 1989

[54] DIGITAL PHASE LOCK LOOP

[75] Inventors: Earl T. Cohen; John A. Swensen, both of Berkeley, Calif.

[73] Assignee: Cyclotomics, Inc., Berkeley, Calif.

[21] Appl. No.: 85,682

[22] Filed: Aug. 17, 1987

[51] Int. Cl.$^4$ ................................................ H03K 5/13
[52] U.S. Cl. .................................... 328/155; 331/1 A; 307/511
[58] Field of Search ...................... 328/155, 133, 55; 331/1 A, 18, 32; 307/511, 527; 377/45, 110

[56] References Cited

U.S. PATENT DOCUMENTS 4,131,856 12/1978 Chapman ............................. 328/155
4,538,119 8/1985 Ashida ............................. 328/155 X
4,668,917 5/1987 Levine ............................. 328/155 X Primary Examiner—Eugene R. LaRoche
Assistant Examiner—Seung Ham
Attorney, Agent, or Firm—Robert M. Wallace

[57] ABSTRACT

A digital phase lock loop includes a variable precision modular counter which adjusts the output phase by changing the counter modulus by an amount proportional to the current modulus of the counter to preserve the effectiveness of each such change over a wide range of moduli, thereby increasing the effective bandwidth of the digital phase lock loop. The digital phase lock loop is characterized by an exponential duty cycle phase adjustment which avoids spurious oscillations due to either overdamping or resonance, thus increasing loop stability.

15 Claims, 4 Drawing Sheets

DIGITAL PHASE LOCK LOOP

BACKGROUND OF THE INVENTION

First Problem

In a digital phase lock loop, the output of a down counter is stabilized to an input (incoming) clock signal by changing the counter modulus. As the frequency of the input clock signal decreases, the counter modulus must increase to maintain synchronization therewith. Unfortunately, as the counter modulus increases, a given change in counter modulus tends to have less and less effect, so that the digital phase lock loop becomes slower in its response to changes in the input clock frequency or phase. Eventually, after the counter modulus has increased to a very large number (to handle a relatively lower input clock frequency), the digital phase lock loop can no longer respond in a timely manner to differences between the input clock and output clock phase or frequency, and therefore it cannot synchronize the two together effectively. Phase lock loops generally are limited to a given bandwidth of input clock frequencies for which phase lock can be achieved. Thus, a first problem is how to increase the bandwidth capability of a digital phase lock loop beyond this seemingly fundamental limitation.

Second Problem

Digital phase lock loops are subject to instabilities or oscillations, depending upon how the output clock phase is adjusted to maintain synchronization with the input clock signal (which is not perfectly stable). Firstly, because of its digital nature, the output clock phase naturally dithers around the input clock phase; one counter modulus value is just too small to reproduce the input clock and the next is just too large. Secondly, adjusting the output clock phase too quickly or too soon may cause spurious oscillations, where the output phase swings madly around the input clock phase. Thirdly, adjusting the output clock phase at a regular interval to avoid such oscillations can introduce resonances in the response of the digital phase lock loop, which can also drive the phase lock loop into spurious oscillation. Despite this, the phase lock loop must adjust the phase by enough to be able to track a specified amount of dither in the input clock signal. However, the digital phase lock loop must not adjust the phase so much that, in the presence of sinusoidal dither in the input clock, it overshoots when the dither changes direction. It would seem that avoiding any one of these difficulties would exacerbate one of the other difficulties. Thus, a second problem is how to avoid all of these foregoing difficulties simultaneously in a single digital phase lock loop.

SUMMARY OF THE INVENTION

Solution to the First Problem

During each cycle in which the counter modulus must be adjusted to maintain synchronization between the output clock signal and the input signal, the counter modulus, rather than being changed by a set amount, is changed by an amount proportional to the current counter modulus. Typically, this amount is a fraction $1/N$ of the modulus $M$. Thus, if the modulus $M$ must be increased, it is increased to $M+M/N$, and if it must be decreased, it is decreased to $M-M/N$. Thus, each change in modulus has the same relative effect, regardless of the current magnitude of the counter modulus. As a result, the digital phase lock loop handles any adjustment in output clock signal phase required to maintain synchronization just as quickly when the modulus is very large as when it is very small. As a result, the digital phase lock loop is able to lock in on an input clock signal having a frequency falling within a very wide bandwidth, a significant advantage.

Solution to the Second Problem

In order to avoid spurious oscillations due either to overly quick adjustments in phase or very regular adjustments in phase, while permitting sufficient phase adjustments to withstand a specified input clock dither and avoiding overshooting in the presence of sinusoidal dither, the phase adjustment is performed in the digital phase lock loop in synchronism with an exponential duty cycle. Thus, with each phase crossing between the input and output clock signals of the digital phase lock loop, the phase is adjusted by a predetermined amount (as discussed previously in connection with the solution to the first problem) at an exponentially decaying rate, each correction of the phase occurring after a longer period of time than the last correction. However, the rate of phase adjustment suddenly increases up to a maximum rate if correction is still required after a certain time. After a set number of corrections have been applied, no more are made to the phase of the output clock signal. The reason for exponentially decaying phase correction rate at first is to dampen any oscillations that might occur from correcting the phase too fast too soon. The exponentially decaying rate also prevents harmonics arising from very regular adjustments in phase. The sudden increase to a high rate of phase adjustments at the end of the process serves to prevent the largest permissible phase drift in the input clock signal from running away. For example, if the phase adjustments kept occurring at an exponentially decaying rate, a large jump in the input clock signal frequency might cause the output clock to drift more than one clock cycle before enough phase adjustments occurred to slow it down. Alternatively, a purely exponentially decreasing phase adjustment rate might leave a phase stranded out of lock for long periods of time, leaving the digital phase lock loop more vulnerable to further dither. The last series of phase corrections performed at the maximum duty cycle rate trades off tightness of lock for a small amount of over-compensation. Any permissible frequency dither in the input clock signal will be caught very quickly; small amounts of dither will be handled gracefully and larger amounts more abruptly. If this last series of maximum rate phase adjustments overcompensates, the next cycle of phase corrections after the next zero-phase crossing will dampen it out.

DESCRIPTION OF THE DRAWINGS

The invention may be understood by reference to the accompanying drawings, of which.

DETAILED DESCRIPTION OF THE INVENTION (1) Brief System Overview

Figure 1:
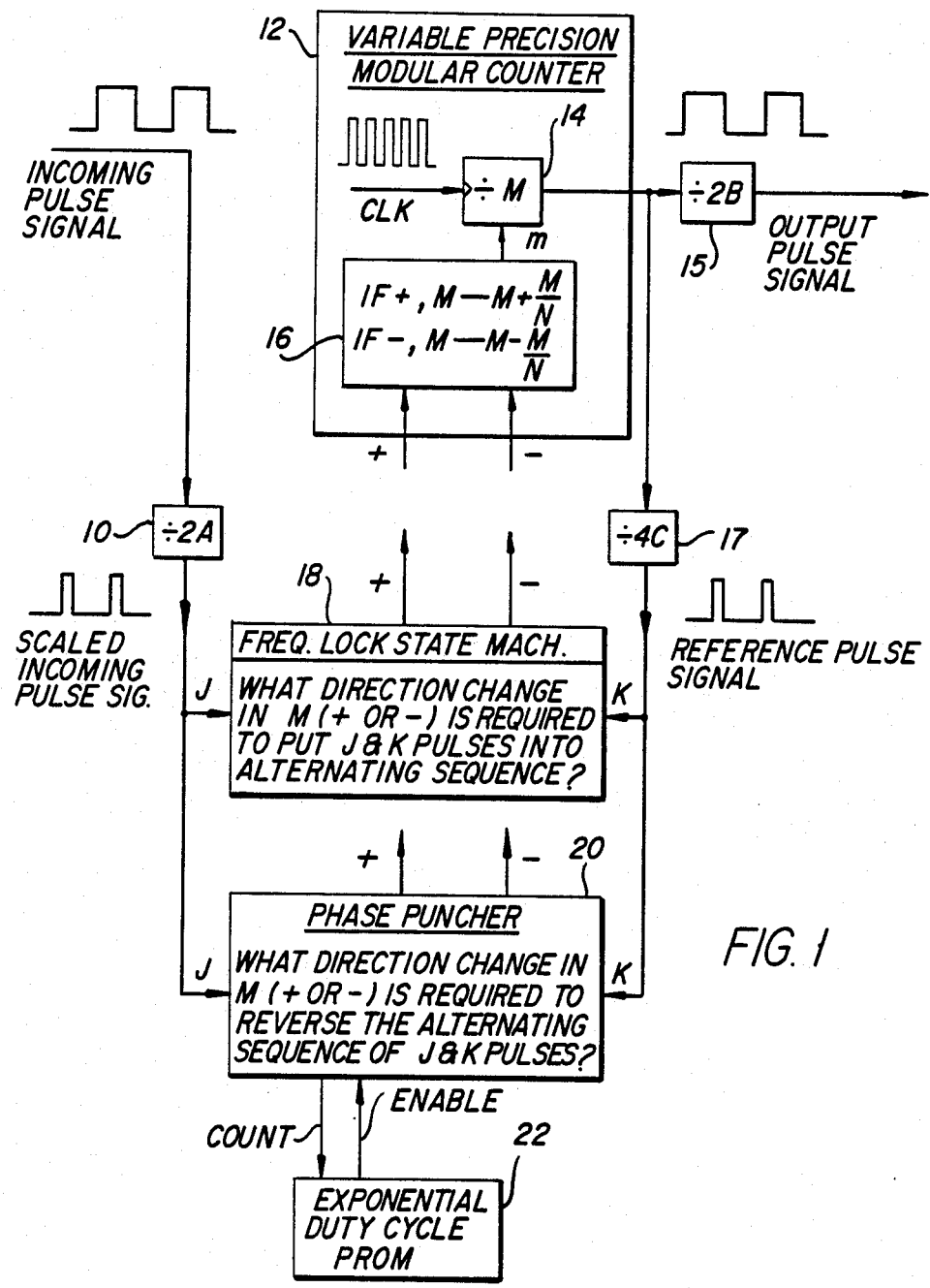
FIG. 1 is a simplified block diagram of the digital phase lock loop of the invention.

Referring to FIG. 1, the digital phase lock loop includes a 2A-divider 10 which divides the frequency of an incoming pulse signal by a ratio 2A to create a scaled incoming pulse signal J. The digital phase lock loop also includes a variable precision modular counter 12 including a modulus M down counter 14 which divides the frequency of an internal clock signal by a modulus M.

The modulus M is controlled by a modulus controller 16 responding to one of two possible control signals, labeled + and −. If the modulus controller 16 receives a + control signal, it changes the modulus M to M+M/N. On the other hand, if a − control signal is received, the modulus controller 16 changes the modulus M to M−M/N.

The output of the modulus M counter 14 is applied to a 2B-divider 15, which divides the counter output frequency by a ratio 2B to generate the output pulse signal of the digital phase lock loop. The output of the counter 14 is also applied to a 4C-divider 17 which divides the counter output frequency by a ratio 4C to generate a reference pulse signal K.

Significantly, the digital phase lock loop frequency locks and phase locks the reference pulse signal to the scaled incoming pulse signal. The ratio of the frequency $f_{out}$ of the output pulse signal to the frequency $f_{in}$ of the incoming pulse signal is C/AB. The user may freely select the parameters A, B and C of the dividers 10, 15 and 17 to achieve any desired ratio between the frequencies of the incoming and output pulse signals. Each of the quantities A, B and C may be any integer, including unity (one).

A frequency lock state machine 18 responds to the pulse signals J and K to generate one or the other of the two control signals + and −. The frequency lock state machine 18 determines what direction change in the modulus M is required to put the J and K pulse signals into alternating sequence (i.e., a sequence in which each J pulse is immediately followed by a K pulse and vice versa). M must be either increased (+) or decreased (−) in order to put the two pulse trains into alternating sequence. The alternating sequence corresponds to frequency lock between the J and K pulse signals. Once the frequency lock state machine 18 has achieved the alternating sequence between J and K pulses, overall control is taken over by a phase puncher 20.

The phase puncher 20 determines what direction change in M (+ or −) is required to reverse the alternating sequence of J and K pulses. Since the current value of the modulus M is either just too large or just too small to exactly reproduce the incoming pulse signal, the state in which the alternating sequence of J and K pulses remains unchanged is undesirable. Thus, changes in the alternating sequence of J and K pulses correspond to phase crossover between the J and K pulse signals and signify phase lock between the J and K pulse signals. The phase puncher issues either the + or the − command signal, depending upon this determination. Issuance of these signals by the phase puncher 20 occurs in synchronism with an enable signal generated by an exponential duty cycle programmable read only memory (PROM) 22. Beginning with each phase crossing, the exponential duty cycle PROM 22 enables the phase puncher to issue + or − commands at an exponentially decaying rate for a period of time and then suddenly increases the rate at which the phase puncher issues command up to a maximum rate before stopping it to await the next phase crossing.

(2) Variable Precision Modular Counter

Figure 2A:
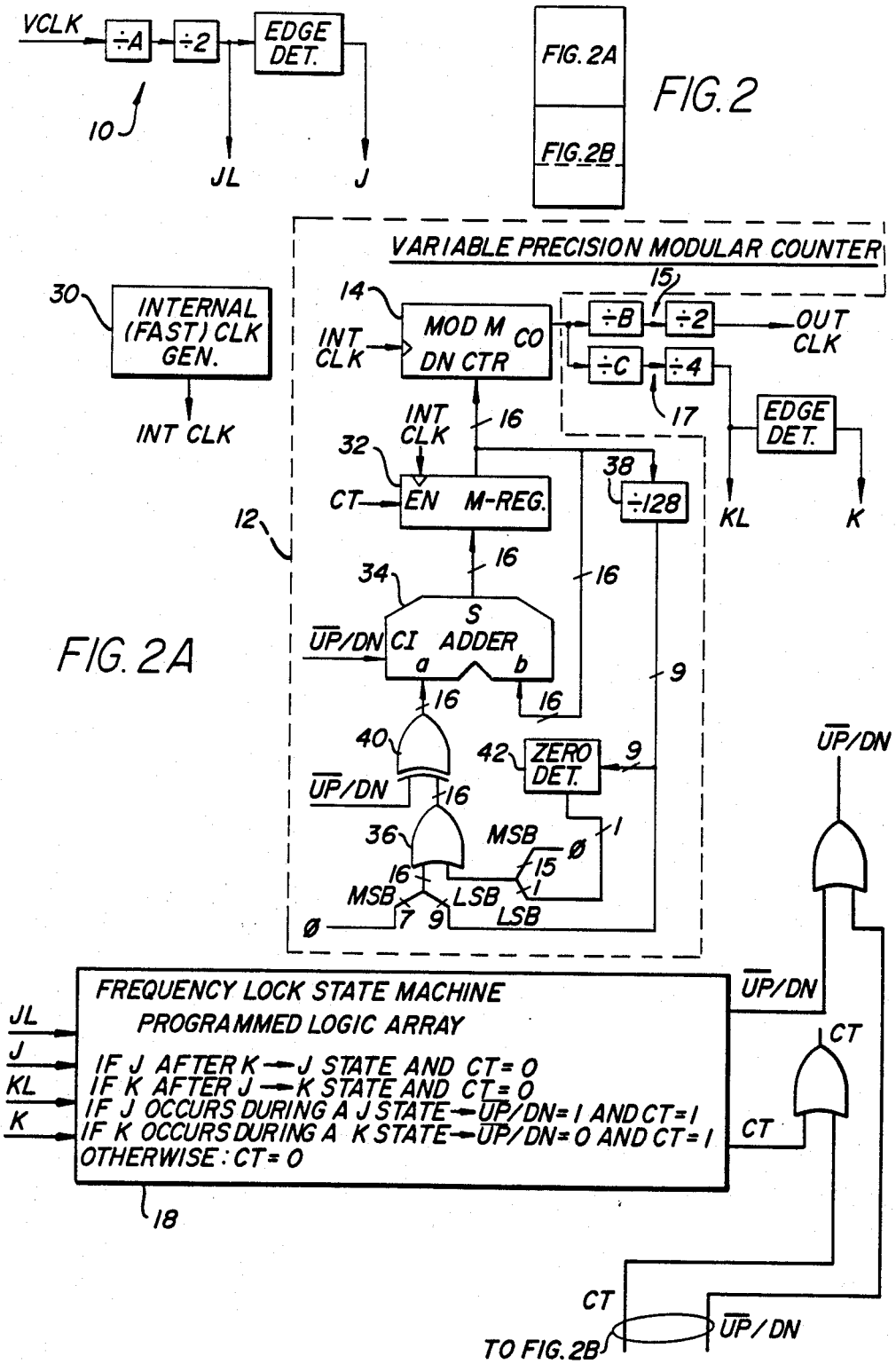
FIGS. 2A and 2B are a more detailed block diagram of the digital phase lock loop of the invention.
Figure 2B:
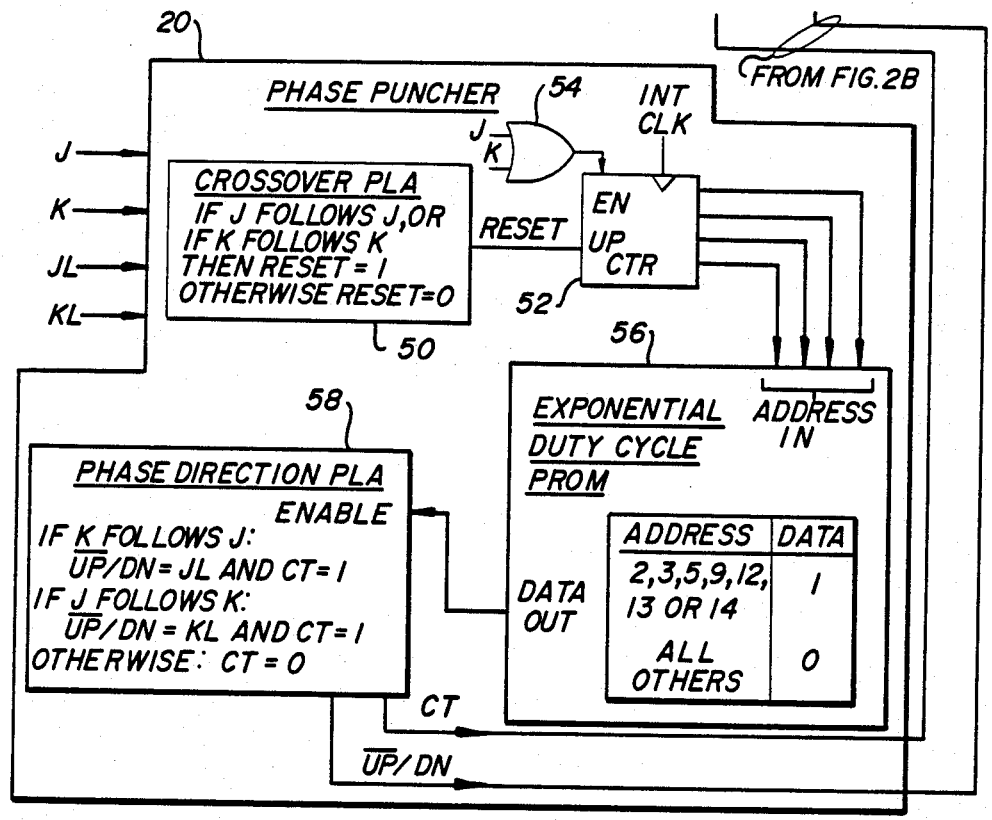

Referring to FIG. 2, the modulus M down counter 14 counts down from M to zero in synchronism with an internal clock signal generated by an internal clock generator 30. The counter 14 receives a 16-bit modulus word M from an M register 32 each time the counter 14 has counted down to zero in preparation for the next counting cycle. The modulus word M is updated (changed) in the register 32 in synchronism with a count signal CT in a manner to be described.

The modulus word M is computed in an adder 34 as follows. The current modulus value M is supplied to the "b" input of the adder 34 and also to a 128-divider 38. The divider 38 divides the 16-bit modulus word M by a number N (where, e.g., N=128). The resulting quotient comprises the nine least significant bits of the first of two 16-bit inputs to an OR gate 36. The remaining 7 bits of the first input to the OR gate 36 comprise zeros.

The other 16-bit input to the OR gate 36 is controlled by a zero-detector 42. Whenever the quotient computed by the divider 38 is zero (a condition which would halt operation of the digital phase lock loop) the zero-detector overrides this condition by causing a sixteen bit non-zero number such as 1 (fifteen zeros followed by a 1) to be applied to the other input of the OR gate 36.

The 16 output bits of the OR gate 36 are applied to a 16-bit exclusive OR gate 40 to be exclusively OR'ed, bit-by-bit, with a one-bit up-down signal (labeled $\overline{UP/DN}$ in FIG. 2), and the resulting 16-bit output of the exclusive OR gate 40 is applied to the "a" input of the adder 34. The up-down signal corresponds to the +/− signal of FIG. 1, and determines whether the output of the 128-divider 38 is added to or subtracted from the modulus word M by the adder 34. In order that the adder 34 may perform subtraction with 2's complement numbers, the carry input (labeled "CI" in FIG. 2) of the adder 34 is set to $\overline{UP/DN}$ so that an extra 1 is added whenever the "a" input of the adder 34 is to be subtracted. Thus, depending upon the state of the up/down signal M/128 is either added or subtracted from M to generate a new 16-bit modulus word to be applied to the down counter 14 in synchronism with the count signal CT (in this example).

(3) Frequency Lock State Machine

Referring to FIG. 2, the frequency lock state machine responds to four pulse signals, JL, J, KL and K. The JL pulse signal is simply the incoming pulse signal frequency-divided by 2A and is called the scaled incoming pulse signal. The J pulse signal is a positive pulse lasting one internal clock cycle commencing with the rising edge of the JL pulse signal. The KL pulse signal is the output of the down counter 14 frequency-divided by 4C and is called the reference pulse signal. The K clock signal is a positive pulse lasting one internal clock cycle commencing with the rising edge of the KL pulse signal. The frequency lock state machine 18 is implemented as a programmable logic array (of the type well known in the art) programmed in accordance with the present invention as follows:

If a J pulse follows a K pulse, the programmable logic array enters a J state and sets the count signal CT to 0. Similarly, if a K pulse follows a J pulse, the programmable logic array enters into a K state and sets the count signal CT to 0. Thereafter, if a J pulse occurs during a J state, the up/down signal is set to 1 and the count signal CT is set to 1 for one internal clock cycle. Alternatively, if a K pulse occurs during a K state, the up/down signal is set to 0 and the count signal CT is set to 1 for one internal clock cycle. Otherwise, the count signal CT remains at 0. Thus, the frequency lock state machine 18 sets the up/down signal to 1 and updates the modulus whenever J is ahead of K, and sets the up/down signal to zero and updates the modulus whenever K is ahead of J, so as to achieve and maintain frequency lock.

(4) Phase Puncher

Referring to FIG. 2, the phase puncher 20 includes a "crossover" programmable logic array 50 programmed in accordance with the present invention to respond to the clock signals J, K, JL and KL, as follows. If a J pulse follows a J pulse, or if a K pulse follows a K pulse, the crossover programmable logic array 50 forces a logic signal called "reset" to logic state 1 for one internal clock cycle. Otherwise, it forces the reset logic signal to logic state 0. An up counter 52 resets its count to 0 each time the reset signal is 1 and otherwise increments its count by 1 each time it receives either a J or K pulse through an OR gate 54. The up counter 52 generates a 4-bit count word which is applied as an address word to a programmable read only memory (PROM) 56.

Depending upon the value of the address word received from the up counter 52, the PROM 56 outputs either a data 1 or a data 0 at its data output, in accordance with the chart illustrated with the PROM 56 in FIG. 2. Thus, whenever the count applied by the counter 52 to the PROM 56 equals 2, 3, 5, 9, 12, 13 or 14, the PROM 56 outputs a data 1, and in all other cases outputs a data 0 to the enable input of a "phase direction" programmable logic array 58.

The phase direction programmable logic array 58 determines whether the output clock phase is ahead or behind the input clock phase. The phase direction programmable logic array 58 is programmed in accordance with the present invention to respond to the clock signals J, K, JL and KL whenever it receives a logic 1 at its enable input, as follows. It sets the up/down signal to JL and sets the CT signal to 1 for one internal clock cycle if K follows J. Conversely, it sets the up/down output signal to the complement of the KL signal and sets the CT signal equal to 1 for one internal clock cycle if J follows K. Otherwise, the phase direction programmable logic array 58 sets the CT signal to 0.

(5) Operation of the Phase Puncher

Under control of the crossover programmable logic array 50, the counter 52 counts the number of zero phase crossings between the clock signals J and K. The exponential duty cycle PROM 56 enables the phase direction programmable logic array 58 at an exponential rate in synchronism with the counter 52. The phase direction programmable logic array 58 simply determines whether the phase of the output clock signal is ahead or behind the input clock signal each time it is enabled by the PROM 56, and changes the state of the up/down signal accordingly.

Figure 3:
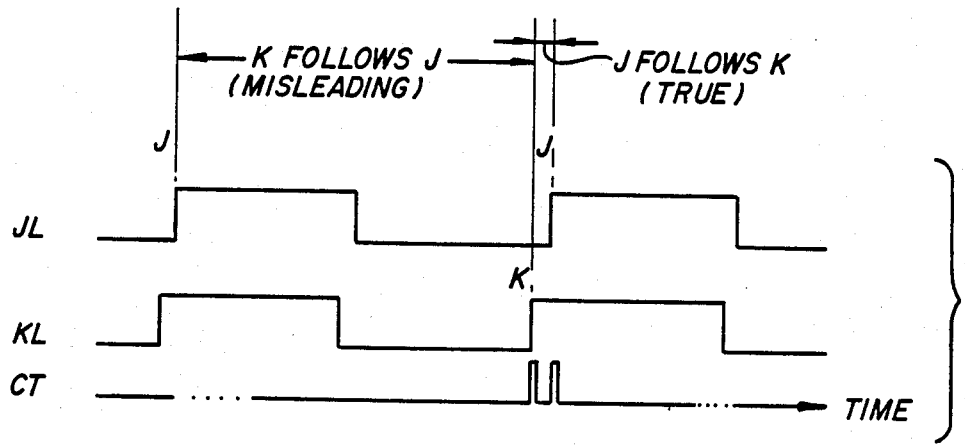
FIGS. 3 and 4 illustrate the operation of the digital phase lock loop of FIG. 2 for two exemplary cases.
Figure 4:
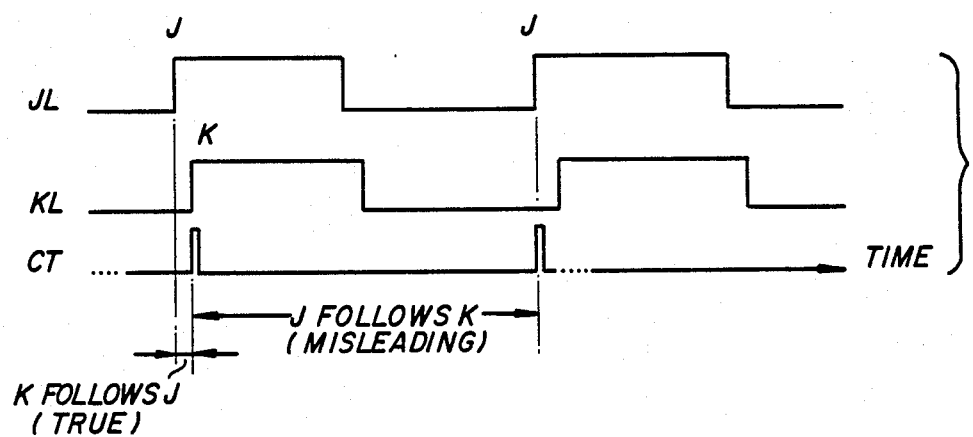

The principle behind the operation of the phase direction program logic array 58 is illustrated in FIGS. 3 and 4. FIG. 3 illustrates the case in which the KL clock signal is slightly ahead of the JL clock signal. During a first period of time, FIG. 3 shows that the K clock signal follows the J clock signal, which is actually misleading since the J and JL clock signals are, in actuality, slightly ahead of the K and KL clock signals. During the next period of time, the J pulse follows the K pulse, which is truly indicative of the actual state of affairs. Note that in the first period of time (when the comparison of K and J apparently provides a misleading answer), by setting the up/down signal to the state of the JL clock signal, a correct answer is obtained. Also note that during the second time window illustrated in FIG. 3 (when J follows K), by setting the up/down signal to the complement of the state of the KL clock signal, a correct answer is obtained.

FIG. 4 illustrates the converse situation in which JL is slightly ahead of KL. During a first time window the K pulse follows the J pulse in FIG. 4, which gives a true indication of the state of affairs (namely, the KL clock signal is behind the JL clock signal). During a second time window, the J pulse follows the K pulse, which provides a misleading indication since the JL clock signal is actually slightly ahead of the KL clock signal. Note that in the first time window, by setting the up/down signal to the state of the JL clock signal, a correct answer is obtained, and in the second time window a correct answer is obtained by setting the up/down clock signal to the complement of the KL clock signal. Thus, when either K is ahead of J (FIG. 3) or when J is ahead of K (FIG. 4), setting up/down to JL when K follows J and to the complement of KL when J follows K will cause the modulus to change in the direction needed to cause a phase crossing.

(6) Exponential Duty Cycle PROM

Figure 5:
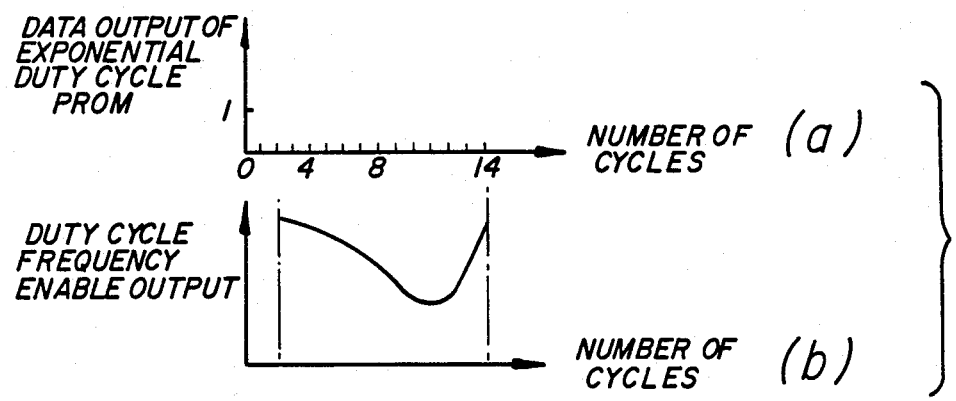
FIGS. 5(a) and 5(b) are a diagram illustrating the exponential duty cycle phase correction performed by the digital phase lock loop of FIG. 2.

Referring to FIG. 5a, the data output signal from the PROM 56 supplied to the enable input of the phase direction program logic array 58 is a logic 1 during the second, third, fifth, ninth, twelfth, thirteenth and fourteenth zero phase crossings between the J and K clock signals. This corresponds roughly to an exponentially time-varying duty cycle rate for the enable output of the PROM 56 as illustrated in FIG. 5b. Note that the duty cycle rate at first decreases exponentially and then suddenly increases up to a maximum rate, so as to avoid spurious oscillations as discussed earlier in this specification.

While the invention has been described in detail with reference to preferred embodiments thereof, it is understood that variations and modifications may be made without departing from the spirit and scope of the invention.

What is claimed is:

1. A digital phase lock loop which phase locks a train of reference pulses to a train of scaled incoming pulses, said digital phase lock loop comprising:
   counter means for frequency-dividing a train of internal clock pulses by a modulus M to produce a counter output pulse signal from which said train of reference pulses may be derived;
   first means for determining whether an increase or a decrease in said modulus M is necessary to put said trains of reference and scaled incoming pulses in alternating sequence;
   second means active whenever said trains of reference and scaled incoming pulses are in alternating sequence for determining whether an increase or a decrease in said modulus M is necessary to reverse the order of said alternating sequence; and
   means responsive to said first and second determining means for either increasing or decreasing said modulus M by an amount which is at least nearly proportional to the present value of said modulus M, whereby said modulus M may vary over a wide range with a minimum change in the effectiveness of each such increasing or decreasing of said modulus M, so that said digital phase lock loop may phase lock said trains of reference and scaled incoming pulses over a wide range of incoming pulse frequencies.

2. The digital phase lock loop of claim 1 wherein said second determining means operates in synchronism with said alternating sequence according to a predetermined frequency profile.

3. The digital phase lock loop of claim 2 wherein said predetermined frequency profile is characterized in that said second determining means activates said increasing and decreasing means at a rate which, at the beginning of said profile, decays exponentially for a first predetermined number of cycles of said alternating sequence, and then increases until it reaches a maximum rate after a second predetermined number of cycles of said alternating sequence corresponding to the end of said profile, and returns to the beginning of said predetermined rate profile whenever said alternating sequence is broken by a non-alternating sequence of one of said reference and scaled incoming pulse trains.

4. The digital phase lock loop of claim 3 wherein said second determining means comprises:
   a. means for counting up with each cycle of said alternating sequence; and
   b. means for activating said increasing and decreasing means whenever said counting means reaches one of a set of predetermined counts, said set of predetermined counts being spaced apart in an exponential pattern.

5. The digital phase lock loop of claim 1 wherein said amount by which said increasing and decreasing means changes said modulus M is equal to M/N, wherein N is an integer.

6. The digital phase lock loop of claim 5 further comprising means operable whenever said modulus M equals 0 for changing M to a non-zero value so as to avoid interruption of the operation of the digital phase lock loop.

7. The digital phase lock loop of claim 1 further comprising:
   means for conducting a train of incoming pulses;
   first divider means connected between said conducting means and said first and second determining means for frequency-dividing said train of incoming pulses by a ratio 2A, wherein A is an integer, to generate said train of scaled incoming pulses;
   second divider means connected between said counter means and said first and second determining means for frequency-dividing said counter output pulse signal by a ratio 4C, wherein C is an integer, to generate said train of reference pulses;
   an output node;
   means connected between said counter means and said output node for frequency-dividing said counter output pulse signal by a ratio 2B, wherein B is an integer, so as to generate a final train of output pulses at said output node, whereby the ratio of the frequency of said final train of output pulses divided by the frequency of said train of incoming pulses is C/AB.

8. The digital phase lock loop of claim 7 wherein each of the quantities A, B, C is any one of the set of positive integers including unity.

9. A digital phase lock loop responsive to an input pulse signal JL, comprising:
   a counter characterized by a modulus M and adapted to repeatedly count down from said modulus M to zero in synchronism with an internal clock and to generate a terminal count pulse signal each time it reaches a count equal zero;
   means for transmitting a reference pulse signal KL in response to said counter pulse signal;
   means responsive to an up or down command for increasing or decreasing, respectively, said modulus M by an amount proportional to the current value of said modulus M;
   means for generating an edge detected version J of the pulse signal JL and an edge detected version K of the pulse signal KL;
   frequency lock means for issuing an up command whenever two J pulses occur before the next K pulse and for issuing a down command whenever two K pulses occur before the next J pulse;
   phase lock means for issuing an up command whenever the phase of J lags the phase of K and for issuing a down command whenever the phase of J leads the phase of K.

10. The digital phase lock loop of claim 9 wherein the presence of each KL and JL pulse corresponds to KL and JL logic 1 states and their absence corresponds to KL and JL logic 0 states, respectively, each up command is a 0 and each down command is a 1, and wherein said phase lock means comprise a programmable logic array adapted to issue up/down commands equal to the JL state whenever K follows J and equal to the complement of the KL state whenever J follows K.

11. The digital phase lock loop of claim 10 wherein said phase lock means comprises:
   a phase counter which counts up with the occurrence of each J or K pulse;
   means for resetting said counter whenever a J pulse follows a J pulse or a K pulse follows a K pulse;
   means for storing a set of predetermined count values; and
   means for enabling said programmed logic array each time the contents of said counter reaches one of said set of predetermined count values.

12. The digital phase lock loop of claim 11 wherein said set of predetermined count values is characterized by a duty cycle rate which exponentially decreases in synchronism with said phase counter until the contents of said phase counter reaches a first predetermined value, and then quickly increases to a maximum rate and then stops after the contents of said phase counter reaches a second predetermined value.

13. The digital phase lock loop of claim 9 wherein said means for increasing and decreasing said modulus comprise:
   a register storing the current value of said modulus M, said register characterized by an input and an output;
   an adder having two inputs and an output, the output of said adder being connected to the input of said register, one of said two adder inputs being coupled to the output of said register;
   means coupled to the output of said register and adapted to transmit an amount proportional to M to the remaining input of said adder; and means for causing said adder to either add or subtract said amount, depending upon whether said command is up or down.

14. The digital phase lock loop of claim 13 further comprising means operable whenever said modulus M is equal to zero for transmitting a non-zero value to said second adder input.

15. The digital phase lock loop of claim 9 further comprising:
   means for receiving an external clock signal;
   means connected to said receiving means for frequency dividing said external clock signal by a ratio 2A, wherein A is an integer, and to produce therefrom said clock signal JL;
   means included with said means for transmitting said signal KL for frequency-dividing the output of said counter by a ratio 4C, wherein C is an integer, so as to produce therefrom said reference pulse signal KL;
   means for dividing the output of said counter by a ratio 2B, wherein B is an integer, so as to generate a final output signal, whereby the ratio between the frequency of said final output signal and the frequency of said external signal is C/AB.

* * * * *